MEANS FOR DISCONNECTING THE SHUNT FEEDBACK LOOP OF AN AMPLIFIER WITHOUT AFFECTING THE AMPLIFICATION

Filed Sept. 13, 1962 2 Sheets-Sheet 1

Oct. 4, 1966 A. SIMON 3,277,387

MEANS FOR DISCONNECTING THE SHUNT FEEDBACK LOOP OF AN AMPLIFIER WITHOUT AFFECTING THE AMPLIFICATION

Filed Sept. 13, 1962 2 Sheets-Sheet 2

United States Patent Office 3,277,387
Patented Oct. 4, 1966

3,277,387

MEANS FOR DISCONNECTING THE SHUNT FEEDBACK LOOP OF AN AMPLIFIER WITHOUT AFFECTING THE AMPLIFICATION

Adolf Simon, Berlin-Steglitz, Germany, assignor to Siemens & Halske Aktiengesellschaft, Berlin and Munich, Germany, a German corporation Filed Sept. 13, 1962, Ser. No. 223,501
Claims priority, application Germany, Sept. 15, 1961, S 75,760, S 75,761
1 Claim. (Cl. 330—106)

The invention disclosed herein is concerned with a high frequency amplifier circuit with shunted feedback and matching between the generator which delivers the input voltage and the amplifier input circuit, especially for high power wireless transmitters. The object of the invention is to improve circuits of this kind so as to increase the feedback factor.

According to the invention, this object is realized by the provision, between the generator and the point of connection of the grid of the amplifier stage with the feedback resistor, of a series resistor which increases the effective internal impedance of the generator circuit, and by matching the actual internal impedance of the generator circuit to the sum of the series resistor and input impedance of the feedback-coupled amplifier stage.

The invention is likewise concerned with amplifier circuits with shunt feedback coupling, especially for high frequency amplifiers or high frequency transmitters, with matching between the generator and the input. A further object resides in selectively connecting and disconnecting the feedback substantially without alternation of the amplification.

According to the invention, this latter object is realized by the provision of a shunt feedback coupling resistance comprising two resistors the connecting point of which can be by means of a switch short-circuited with respect to ground, whereby the resistance ratio of the two resistors is so selected that the feedback coupling is disconnected while maintaining the amplification constant.

The various objects and features of the invention will appear from the description thereof which is rendered below with reference to the accompanying drawings.

Figure 1:
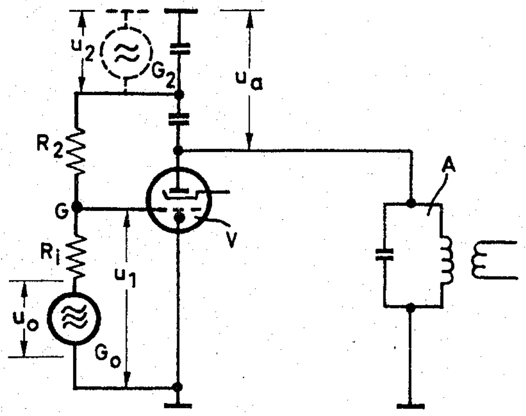
Fig.1 PRIOR ART
FIG. 1 shows an example of a high frequency amplifier circuit with shunt feedback coupling, especially for wireless transmitters, to which the invention is directed.

It is known to conduct the anode alternating voltage of an amplifier stage over a resistor to the grid, thereby effecting a feedback. An example of such a circuit, comprising an amplifier tube stage V and an output circuit A in the anode branch, is shown in FIG. 1. The voltage of an input generator $G_0$ is designated by $u_0$, the internal impedance of the generator $G_0$ is indicated at $R_i$, reference $u_2$ indicating the part of the anode alternating voltage $u_a$ which is over a resistor $R_2$ conducted to the feedback coupling loop, and the grid alternating voltage of the tube is indicated by $u_1$. The grid of the tube is not preloaded in order to operate with as low a power of the generator $G_0$ as is possible.

Figure 2:
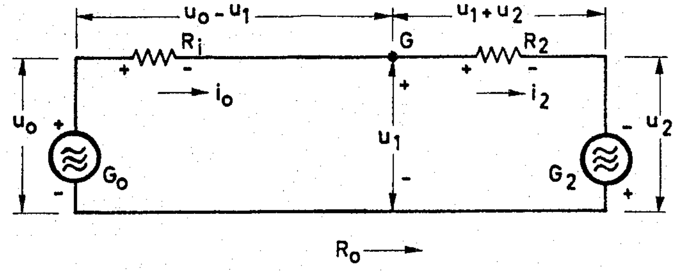
Fig.2 PRIOR ART
FIG. 2 represents an equivalent circuit diagram for the circuit according to FIG. 1.

Certain conditions, which appear from the equivalent circuit diagram shown in FIG. 2, must be met in the anode circuit for the matching of the circuit to the generator $G_0$, with respect to the resistor $R_2$ and the voltage $u_2$ of an imagined feedback coupling generator $G_2$. In FIG. 2 are represented the momentary values of the voltages $u_0$, $u_1$ and $u_2$. For the generator $G_0$ appears at the point G a fictitious impedance $R_0$:

$$R_0=\frac{u_1}{i_0}=\frac{u_1}{i_2}$$

After some recalculation there will be obtained, from the matching requirement $R_0=R_i$, the requirement for the impedance ratio:

$$\frac{R_2}{R_i}=1+\frac{u_2}{u_1}$$

The generator $G_0$ is under these conditions correctly matched. The obtainable feedback coupling factor is:

$$k=2\cdot\frac{1+u_2/u_1}{2+u_2/u_1}$$

For a very great ratio $u_2/u_1$ there will be obtained as a border value, a maximum feedback coupling factor $k_{max}=2$ which corresponds to a feedback coupling of 6 db.

Figure 3:
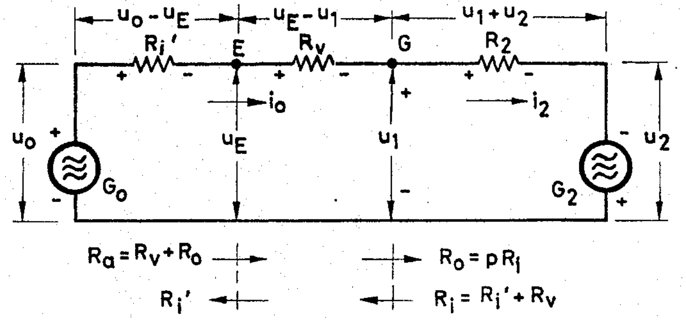
FIG. 3 is an equivalent circuit diagram for a circuit according to the invention, whereby the circuit shown in FIG. 1 is improved.

In order to increase the obtainable feedback coupling, it is according to the invention proposed to increase the effective internal impedance $R_i$ of the generator $G_0$, by the provision of an auxiliary resistor $R_v$, as shown in FIG. 3. As seen from the point G, there will apply as internal impedance, for the generator $G_2$, the left circuit portion $R_i=R_i'+R_v$. In the case of matching, the right hand part, as seen from the point E, must have for the generator $G_0$ the impedance $R_i'$. It will be apparent, therefore, that the impedance defined at the point G must be smaller than $R_i$. The factor $p$ is for this purpose introduced. The value $p=1$ applies in a case without series resistor $R_v$. There is $$R_0=\frac{u_1}{i_0}=\frac{u_1}{i_2}=pR_i;\ p\leqq 1$$

The following applies for the requirement pertaining to the matching of the generator $G_0$ at the point E:

$$R_v+R_0=R_i'$$

Analogously to the previously calculated relations, there will result for the matching an impedance ratio:

$$\frac{R_2}{R_i}=p\cdot\left(1+\frac{u_2}{u_1}\right)$$

and a feedback coupling factor $k$:

$$k=1+\frac{u_2/u_1}{1+p(1+u_2/u_1)}$$

In this circuit, the border value for the obtainable feedback coupling factor (for $u_2/u_1>>1$) is:

$$k_{max.}=1+\frac{1}{p}$$

It is in this manner possible, by the selection of the factor $p$, to obtain a feedback coupling factor which is considerably greater than 2. The power to be supplied by the generator $G_0$ is thereby likewise increased.

It is desirable in some applications, for example, in the tuning of a sender or transmitter having a high frequency feedback coupling over one or more stages, to disconnect the feedback coupling during the tuning operation. This is advantageously done without changing the total amplification of the arrangement while the feedback coupling is disconnected. The present shunt feedback coupling is for such a circuit particularly advantageous. The feedback coupling is in the described example applied to only one stage; it is, however, possible to apply the feedback coupling to a plurality of stages and to operate such couplings in the same manner.

Figure 4:
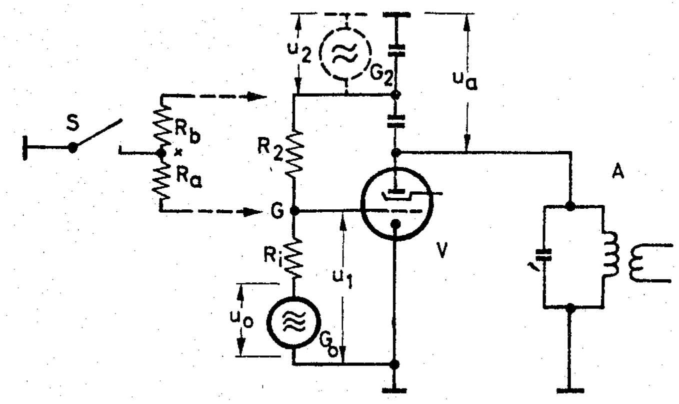
FIG. 4 shows a further example of a high frequency amplifier circuit with shunt feedback coupling, to which the invention is directed.
Figure 5:
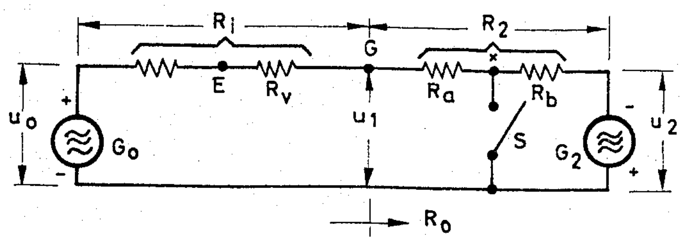
FIG. 5 represents an equivalent circuit diagram for a circuit according to the invention, whereby the circuit shown in FIG. 4 is improved, the corresponding circuit modification being indicated in FIG. 4 at the left end thereof.

As mentioned before, the fictitious resistance $R_o$ is for the matching of the generator to the circuit, so adjusted that the generator is correctly matched at the point E. However, the resistance $R_2$ is according to the invention formed by two resistors $R_a$ and $R_b$. This embodiment of the invention is in its principal circuitry represented in FIGS. 4 and 5. The resistance $R_a$ lying at the point G is made equal to $R_o$. According to the invention, there is provided a switch S over which the connecting point $x$ between the resistors $R_a$ and $R_b$ can be grounded for the purpose of disconnecting the feedback coupling. Upon properly dimensioning the resistance ratio $R_a$ to $R_b$, the amplification will remain constant during such disconnection of the feedback coupling. The generator $G_o$ thus remains properly adjusted when the connecting point $x$ between the two resistors is grounded over the switch S, as the voltage at the point G is not changed by such grounding since the current $i_o$ remains the same, but the influence of the generator $G_2$ is excluded. The feedback coupling is accordingly ineffective. It is in this manner possible to disconnect the feedback coupling without altering the voltage on the grid of the amplifier tube and therefore, without altering the amplification of the arrangement.

Changes may be made within the scope and spirit of the appended claim which defines what is believed to be new and desired to have protected by Letters Patent.

I claim:

High frequency amplifier circuit with shunt feedback coupling and matching between the generator which delivers the input voltage and the amplifier input, especially for wireless transmitters, comprising a generator, an amplifier stage having a pair of input and a pair of output terminals, a feedback circuit including two serially connected resistors connected between one output terminal and one input terminal of said amplifier stage, the other of each of said input and output terminals connected to a reference potential, a series resistance connected from one side of the generator to the point at which said first named resistance is connected with said one input terminal, the other side of said generator connected to the other input terminal and the outer output terminal of said amplifier stage, said series resistance having a value to increase the effective internal impedance of the generator circuit and having such value that the internal impedance of the generator is matched to the sum of said series resistance and the input impedance of the feedback coupled amplifier stage, and a switch connected between the connecting point between said resistors and the reference potential, the resistance values of said serially connected resistors being so determined that the resistance ratio therebetween is such that the feedback is upon shunting thereof disconnected while the amplification of said amplifier remains unaffected thereby.

References Cited by the Examiner

UNITED STATES PATENTS 2,286,337 6/1942 Bruck ------------ 330—185 X

OTHER REFERENCES

Gray, T. S.: Applied Electronics, New York, John Wiley & Sons, 1954, page 807.

Korn, G. A. and Korn, T. M.: Electronic Analog Computers, New York, McGraw-Hill, 1956, page 13.

Seely: Electron-Tube Circuits, McGraw-Hill, New York, 1958, pages 69, 70 and 176–180.

ROY LAKE, *Primary Examiner.*

T. M. WEBSTER, N. KAUFMAN, R. KANANEN, *Assistant Examiners.*